(12) United States Patent
Desabhatla

(10) Patent No.: US 8,903,664 B2
(45) Date of Patent: Dec. 2, 2014

(54) SYSTEM AND METHOD FOR USE IN MONITORING SYNCHRONOUS MACHINES

(75) Inventor: Sreedhar Desabhatla, Munich (DE)

(73) Assignee: General Electric Company, Schenectady, NY (US)

( * ) Notice: Subject to any disclaimer, the term of this patent is extended or adjusted under 35 U.S.C. 154(b) by 822 days.

(21) Appl. No.: 13/166,317

(22) Filed: Jun. 22, 2011

(65) Prior Publication Data

US 2012/0326881 A1    Dec. 27, 2012

(51) Int. Cl.
*G01R 31/02* (2006.01)
*G08B 21/00* (2006.01)
*G06F 19/00* (2011.01)
*G01R 31/34* (2006.01)
*H04Q 9/00* (2006.01)
*H02H 7/06* (2006.01)

(52) U.S. Cl.
CPC ........... *G01R 31/343* (2013.01); *H04Q 9/00* (2013.01); *H02H 7/06* (2013.01); *G01R 31/025* (2013.01); *H04Q 2209/845* (2013.01)
USPC .................. 702/58; 318/798; 324/765.01

(58) Field of Classification Search
CPC ...... G01R 31/025; G01R 31/343; H02H 7/06; H02H 7/09; H02H 1/0092; H02K 17/30; H04Q 2209/845; H04Q 9/00
USPC ............. 702/57, 58, 60, 64, 66, 96, 105, 106, 702/182, 183, 185; 318/798; 324/510, 324/765.01
See application file for complete search history.

(56) References Cited

U.S. PATENT DOCUMENTS 6,611,771 B1 *  8/2003  Habetler et al. ................. 702/58
6,798,210 B2    9/2004  Goodrich et al.
6,911,838 B2    6/2005  Rao et al.

(Continued)

FOREIGN PATENT DOCUMENTS

CN    101017191 A    8/2007
CN    101025434 A    8/2007

(Continued)

OTHER PUBLICATIONS

D. R. Albright, Interturn Short-circuit Detector for Turbine-Generator Rotor Windings, Institute of Electrical and Electronics Engineers Summer Power Meeting and EHV Conference, Jul. 1970, 12 pages.

(Continued)

*Primary Examiner* — John H Le
(74) *Attorney, Agent, or Firm* — Armstrong Teasdale LLP

(57) ABSTRACT

A method for use in monitoring a synchronous machine includes coupling a power conversion assembly to an electric power source and to a synchronous machine. The synchronous machine includes a plurality of winding inter-turn portions. The method also includes energizing the synchronous machine via the power conversion assembly. The method further includes recording at least one first operational measurement of the power conversion assembly and the synchronous machine. The method also includes calculating a first impedance downstream of the power conversion assembly based on the first operational measurement. The method further includes recording at least one second operational measurement of the power conversion assembly and the synchronous machine. The method also includes calculating a second impedance downstream of the power conversion assembly based on the second operational measurement. The method further includes estimating a short circuit associated with adjacent winding inter-turn portions based on the first and second operational measurements.

20 Claims, 6 Drawing Sheets

(56) References Cited

U.S. PATENT DOCUMENTS

| | | |
|---|---|---|
| 7,411,404 B2 | 8/2008 | Rai |
| 7,592,772 B2 | 9/2009 | Nandi et al. |
| 7,750,663 B2 * | 7/2010 | Cop .................. 324/765.01 |
| 2010/0030502 A1 | 2/2010 | Higgins |

FOREIGN PATENT DOCUMENTS

| | | |
|---|---|---|
| CN | 101101319 A | 1/2008 |
| CN | 101221206 A | 7/2008 |
| SU | 1352579 A1 | 11/1987 |
| SU | 1449943 A1 | 1/1989 |
| WO | 2008148075 A1 | 12/2008 |

OTHER PUBLICATIONS

Gerald B. Kliman, et al., A New Method for Synchronous Generator Core Quality Evaluation, IEEE Transactions on Energy Conversion, Sep. 2004, pp. 576-582, vol. 19, No. 3.

* cited by examiner

SYSTEM AND METHOD FOR USE IN MONITORING SYNCHRONOUS MACHINES

BACKGROUND OF THE INVENTION

The subject matter disclosed herein relates generally to synchronous machines and, more specifically, to systems and methods for use in monitoring the physical condition of a synchronous machine.

At least some known synchronous machines are used with combustion machines, such as combustion engines, including gas turbine engines. At least some known synchronous machines are rotatably coupled to a gas turbine engine via a generator drive shaft such that the synchronous machine is operated as a generator during electric power generation operation of the gas turbine engine. Many known synchronous machines are also operated as a starting motor to accelerate the generator drive shaft and the associated gas turbine engine to a predetermined speed during start-up operations.

Known synchronous machines include a stationary stator and a rotatable rotor that are oriented such that the stator circumscribes the rotor. At least some know rotors include a plurality of windings that extend axially along the length of the rotor. Each winding includes two inter-turn portions that each wrap around the two far ends of the rotor. The windings are separated from each other to reduce the probability of a short circuit of two adjacent inter-turns that may develop over a period of time as rotational forces are exerted on worn windings. However, despite such orientation, some known rotors may still develop an inter-turn short over time.

Inter-turn shorts create a decreased number of ampere-turns that result in an unequal flux distribution within the synchronous machine. Such a decrease in ampere-turns requires the field current transmitted through the rotor windings be increased to maintain a predetermined torque and/or load on the synchronous machine. The increased current in the windings increases the temperatures of the rotor windings, and the temperatures may approach predetermined operating parameters. Also, the portion of the rotor pole that includes the shorts may not receive as much field current as the portion of the rotor that does not have any shorts. Such an imbalance in field current may result in the portion with the shorts having a lower temperature than the portion of the rotor pole without the shorts. Moreover, the portion of the rotor with the higher temperature tends to elongate axially more than the portion with the lower temperatures and may induce axial bowing forces into the pole. The induced bowing forces may bend the rotor sufficiently to induce torque pulsations that result in rotor pole vibration. Moreover, rotor bowing may cause rotor bearing temperatures to increase.

Typically, inter-turn shorts on the rotor pole are a slow-developing incipient fault and may not be detected until the fault becomes severe. Detecting and/or predicting an inter-turn short or any other slow-developing fault in a synchronous machine is very difficult without monitoring the flux density inside the synchronous machine when it is operating. The use of external measurement means, including flux probes, requires additional and expensive measurement hardware and software. Other external measurement means, such as boroscopic inspections, can only be performed when the machine is removed from service, thereby increasing potential losses of electric power generation revenue and increasing costs of shutdown maintenance operations.

BRIEF DESCRIPTION OF THE INVENTION

In one aspect, a method for use in monitoring a synchronous machine that includes a plurality of winding inter-turn portions is provided. The method includes coupling a power conversion assembly to an electric power source and to a synchronous machine. The method also includes energizing the synchronous machine via the power conversion assembly. The method further includes recording, by a computing device, at least one first operational measurement of at least one of the power conversion assembly and of the synchronous machine. The method also includes calculating, by the computing device, a first impedance downstream of the power conversion assembly based on the at least one first operational measurement. The method further includes recording, by the computing device, at least one second operational measurement of at least one of the power conversion assembly and the synchronous machine. The method also includes calculating, by the computing device, a second impedance downstream of the power conversion assembly based on the at least one second operational measurement. The method further includes estimating, by the computing device, at least one short circuit associated with adjacent winding inter-turn portions based on the first and second operational measurements.

In another aspect, a system for use in monitoring a synchronous machine including a plurality of winding inter-turn portions is provided. The synchronous machine is operatively coupled to a power conversion assembly. The system includes a memory device configured to store a plurality of operational measurements of at least one of the power conversion assembly and the synchronous machine. Each operational measurement is associated with a time. The system also includes a processor operatively coupled in communication with the memory device. The memory device includes programmed computer instructions that instruct the processor to calculate a plurality of impedances downstream of the power conversion assembly. Each calculated impedance is associated with a time. The memory device also includes programmed computer instructions that instruct the processor to estimate at least one short circuit associated with adjacent winding inter-turn portions based on the calculated impedances.

In yet another aspect, one or more non-transitory computer-readable storage media having computer-executable instructions embodied thereon is provided. When executed by at least one processor, the computer-executable instructions cause the processor to communicate with a memory device to cause the memory device to store and retrieve a plurality of operational measurements of at least one of a power conversion assembly and a synchronous machine operatively coupled to the power conversion assembly. Each operational measurement is associated with a time. Also, when executed by the at least one processor, the computer-executable instructions cause the processor to communicate with a memory device to cause the memory device to calculate a plurality of impedances downstream of the power conversion assembly. Each calculated impedance is associated with a time. Further, when executed by the at least one processor, the computer-executable instructions cause the processor to estimate at least one short circuit associated with adjacent winding inter-turn portions in the synchronous machine based on the calculated impedances.

DETAILED DESCRIPTION OF THE INVENTION

Figure 1:
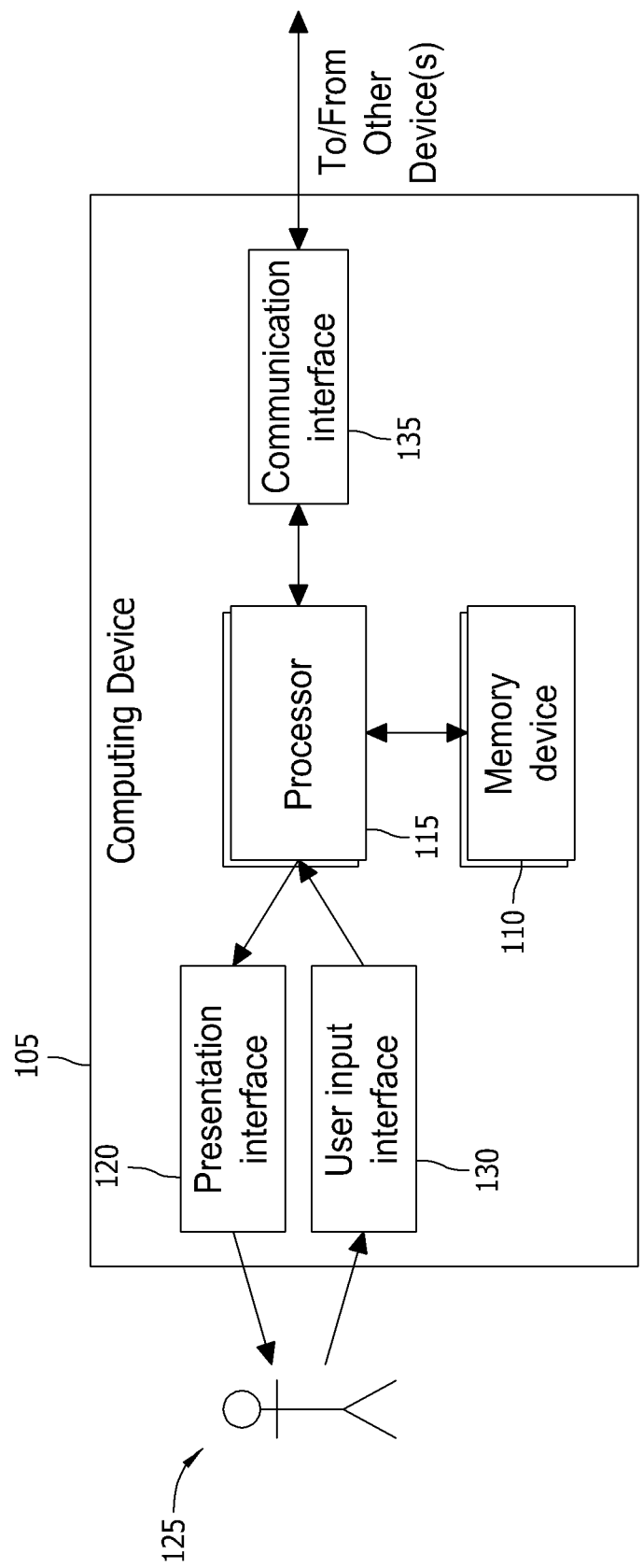
FIG. 1 is a block diagram of an exemplary computing device that may be used to monitor and/or control the operation of a combustion machine.

FIG. 1 is a block diagram of an exemplary computing device 105 that may be used to monitor and/or control the operation of a combustion machine (not shown in FIG. 1). Computing device 105 includes a memory device 110 and a processor 115 operatively coupled to memory device 110 for executing instructions. In some embodiments, executable instructions are stored in memory device 110. Computing device 105 is configurable to perform one or more operations described herein by programming processor 115. For example, processor 115 may be programmed by encoding an operation as one or more executable instructions and providing the executable instructions in memory device 110. Processor 115 may include one or more processing units (e.g., in a multi-core configuration).

In the exemplary embodiment, memory device 110 is one or more devices that enable storage and retrieval of information such as executable instructions and/or other data. Memory device 110 may include one or more computer readable media, such as, without limitation, dynamic random access memory (DRAM), static random access memory (SRAM), a solid state disk, and/or a hard disk. Memory device 110 may be configured to store operational measurements including, without limitation, vibration readings, field voltage and current readings, field reference setpoints, stator voltage and current readings, rotor speed readings, maintenance tasks, and/or any other type of data. In some embodiments, processor 115 removes or "purges" data from memory device 110 based on the age of the data. For example, processor 115 may overwrite previously recorded and stored data associated with a subsequent time and/or event. In addition, or alternatively, processor 115 may remove data that exceeds a predetermined time interval.

In some embodiments, computing device 105 includes a presentation interface 120 coupled to processor 115. Presentation interface 120 presents information, such as a user interface and/or an alarm, to a user 125. For example, presentation interface 120 may include a display adapter (not shown) that may be coupled to a display device (not shown), such as a cathode ray tube (CRT), a liquid crystal display (LCD), an organic LED (OLED) display, and/or an "electronic ink" display. In some embodiments, presentation interface 120 includes one or more display devices. In addition, or alternatively, presentation interface 120 may include an audio output device (not shown) (e.g., an audio adapter and/or a speaker) and/or a printer (not shown). In some embodiments, presentation interface 120 presents an alarm associated with a synchronous machine (not shown in FIG. 1), such as by using a human machine interface (HMI) (not shown).

In some embodiments, computing device 105 includes a user input interface 130. In the exemplary embodiment, user input interface 130 is coupled to processor 115 and receives input from user 125. User input interface 130 may include, for example, a keyboard, a pointing device, a mouse, a stylus, a touch sensitive panel (e.g., a touch pad or a touch screen), a gyroscope, an accelerometer, a position detector, and/or an audio input interface (e.g., including a microphone). A single component, such as a touch screen, may function as both a display device of presentation interface 120 and user input interface 130.

A communication interface 135 is coupled to processor 115 and is configured to be coupled in communication with one or more other devices, such as a sensor or another computing device 105, and to perform input and output operations with respect to such devices. For example, communication interface 135 may include, without limitation, a wired network adapter, a wireless network adapter, a mobile telecommunications adapter, a serial communication adapter, and/or a parallel communication adapter. Communication interface 135 may receive data from and/or transmit data to one or more remote devices. For example, a communication interface 135 of one computing device 105 may transmit an alarm to the communication interface 135 of another computing device 105.

Presentation interface 120 and/or communication interface 135 are both capable of providing information suitable for use with the methods described herein (e.g., to user 125 or another device). Accordingly, presentation interface 120 and communication interface 135 may be referred to as output devices. Similarly, user input interface 130 and communication interface 135 are capable of receiving information suitable for use with the methods described herein and may be referred to as input devices.

Figure 2:
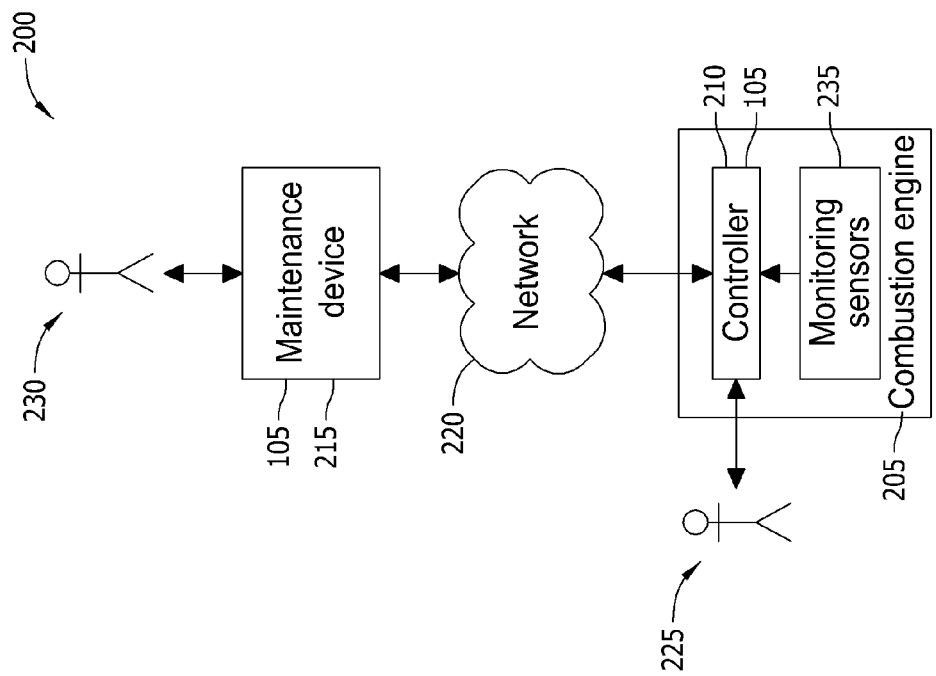
FIG. 2 is block diagram of an exemplary combustion engine monitoring system that includes a combustion engine, and a combustion engine controller and a maintenance device coupled in communication via a network.

FIG. 2 is block diagram of an exemplary system 200 that may be used to monitor and/or operate a combustion engine 205. In the exemplary embodiment, system 200 includes a combustion engine controller 210 and a maintenance device 215 coupled in communication with each other via a network 220. Network 220 may include, without limitation, the Internet, a local area network (LAN), a wide area network (WAN), a wireless LAN (WLAN), a mesh network, and/or a virtual private network (VPN). While certain operations are described below with respect to particular computing devices 105, it is contemplated that any computing device 105 may perform one or more of the described operations. For example, controller 210 may perform all of the operations below.

Referring to FIGS. 1 and 2, controller 210, and maintenance device 215 are computing devices 105. In the exemplary embodiment, each computing device 105 is coupled to network 220 via communication interface 135. In an alternative embodiment, controller 210 is integrated with maintenance device 215.

Controller 210 interacts with an operator 225 (e.g., via user input interface 130 and/or presentation interface 120). For example, controller 210 may present information about combustion engine 205, such as alarms, to operator 225. Maintenance device 215 interacts with a technician 230 (e.g., via user input interface 130 and/or presentation interface 120). For example, maintenance device 215 may present alarms and/or maintenance tasks to technician 230.

Combustion engine 205 includes one or more monitoring sensors 235. In exemplary embodiments, monitoring sensors 235 collect operational measurements including, without limitation, vibration readings, field voltage and current readings, field reference setpoints, stator voltage and current readings, rotor speed readings, maintenance tasks, and/or any other type of data. Monitoring sensors 235 repeatedly (e.g., periodically, continuously, and/or upon request) transmits operational measurement readings at the current time. For example, monitoring sensors 235 may produce an electrical current between a minimum value (e.g., 4 milliamps (ma)) and a maximum value (e.g., 20 ma). The minimum valve is representative of an indication that no field current is detected and the maximum value is representative of an indication that a highest detectable amount of field current is detected. Controller 210 receives and processes the operational measurement readings.

Figure 3:
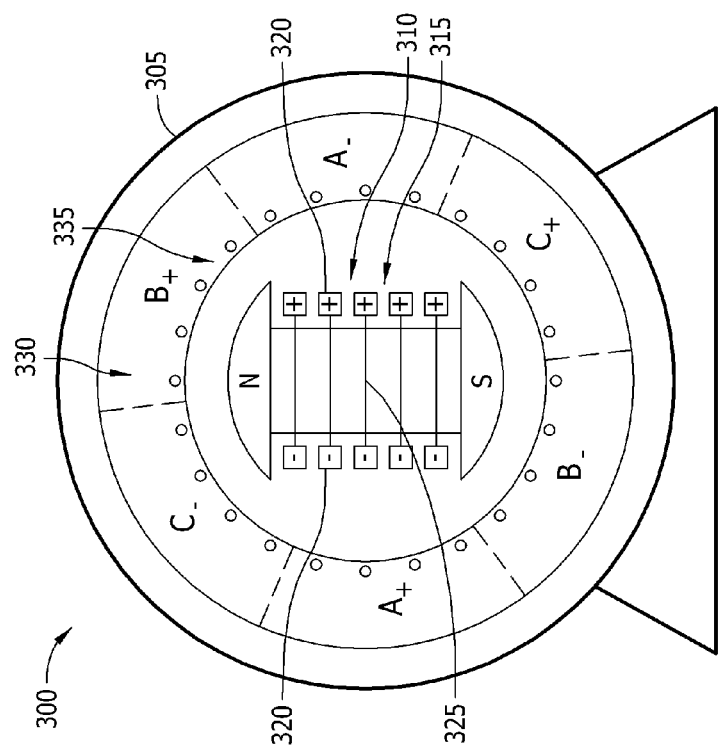
FIG. 3 is a schematic view of an exemplary synchronous machine that may be used with the combustion engine shown in FIG. 2.

FIG. 3 is a schematic view of an exemplary synchronous machine 300 that may be used with combustion engine 205 (shown in FIG. 2). In the exemplary embodiment, synchronous machine 300 includes a casing 305. Synchronous machine 300 also includes a rotatable member, or rotor 310 that includes a plurality of rotor windings 315, a north pole N, and a south pole S. Each of rotor windings 315 include an axial portion 320 that extends axially along the length (not shown) of rotor 310. Each of rotor windings 315 also includes an inter-turn portion 325 that each wraps around each of the two far ends (not shown) of rotor 310. Windings 315 are positioned and/or insulated such that they are separated from each other to reduce the probability of a short circuit, or short of two adjacent winding inter-turn portions 325. Such shorts may develop over a period of time due to wear as a result of rotational forces exerted on winding inter-turn portions 325. Synchronous machine 300 further includes a stator 330 that extends about rotor 310. Stator 330 includes a plurality of stator windings 335. In the exemplary embodiment, synchronous machine 300 may be operated as a synchronous motor and a synchronous generator.

Figure 4:
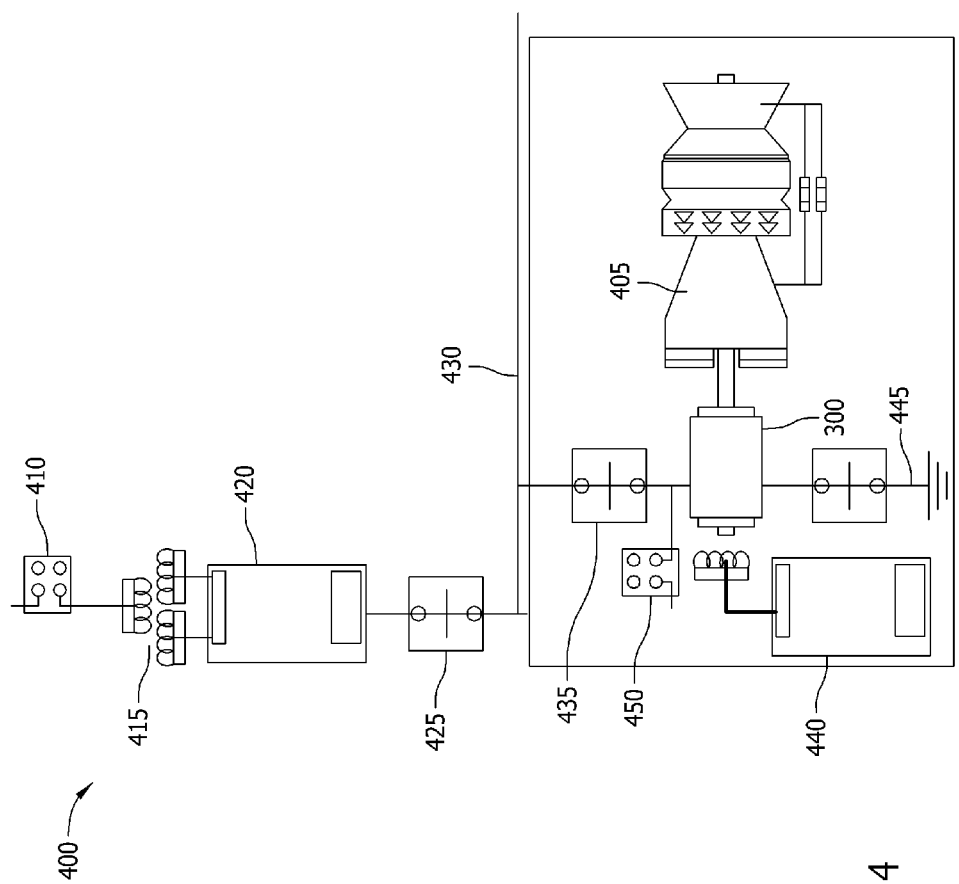
FIG. 4 is a schematic view of an exemplary starting system that includes the synchronous machine shown in FIG. 3.

FIG. 4 is a schematic view of an exemplary starting system 400 that includes synchronous machine 300. Synchronous machine 300 is rotatably coupled to a combustion engine 405 that, in the exemplary embodiment, is a gas turbine engine. Alternatively, synchronous machine 300 is coupled to any apparatus that requires a motor-driven starting device. Starting system 400 also includes a starting circuit breaker 410. Circuit breaker 410 is closed to drive synchronous machine 300 as a synchronous motor and is open otherwise. Starting system 400 further includes a dual secondary transformer 415 coupled to circuit breaker 410. Alternatively, any transforming device may be used with starting system 400.

In the exemplary embodiment, starting system includes a power conversion assembly, i.e., a load commutated inverter (LCI) 420. LCI 420 includes a plurality of silicon controlled rectifier (SCR) converters (not shown) that convert alternating current (AC) electric power having a predetermined amplitude and frequency to a desired frequency with predetermined voltage and current waveforms. Starting system also includes a bus switch 425 coupled to LCI 420 and a bus 430. Starting system 400 further includes a synchronous motor start switch 435 coupled to stator windings 335 (shown in FIG. 3) of synchronous machine 300.

In the exemplary embodiment, synchronous machine 300 is coupled to a generator excitation system 440, a grounding system 445, and a generator circuit breaker 450.

In operation, starting circuit breaker 410 is closed to energize dual secondary transformer 415 and LCI 420. Switches 425 and 435 are closed to transmit converted electric power to stator windings 335 of synchronous machine 300. Synchronous machine 300 operates as a synchronous motor to accelerate combustion engine 405 from a turning ear (not shown) speed of approximately 0% of rated speed to a predetermined purge speed within a range of approximately 25% to 33% of rated speed. Synchronous machine 300 rotates combustion engine 405 at the purge speed for a time range of approximately 17 to 23 minutes to purge potentially remaining combustibles from combustion engine 405. Upon completion of purging, synchronous machine 300 accelerates combustion engine 405 until a range of approximately 85% to 91% of rated speed. Switches 425 and 435 and breaker 410 are opened to isolate stator windings 335 from LCI 420. Combustion engine 405 uses fuel and air combustion to accelerate combustion engine 405 to approximately 100% of rated speed. Excitation system 440 is used to transmit a direct current to rotor windings 315, generator circuit breaker 450 is closed, and synchronous machine 300 is operated as a synchronous generator.

Figure 5:
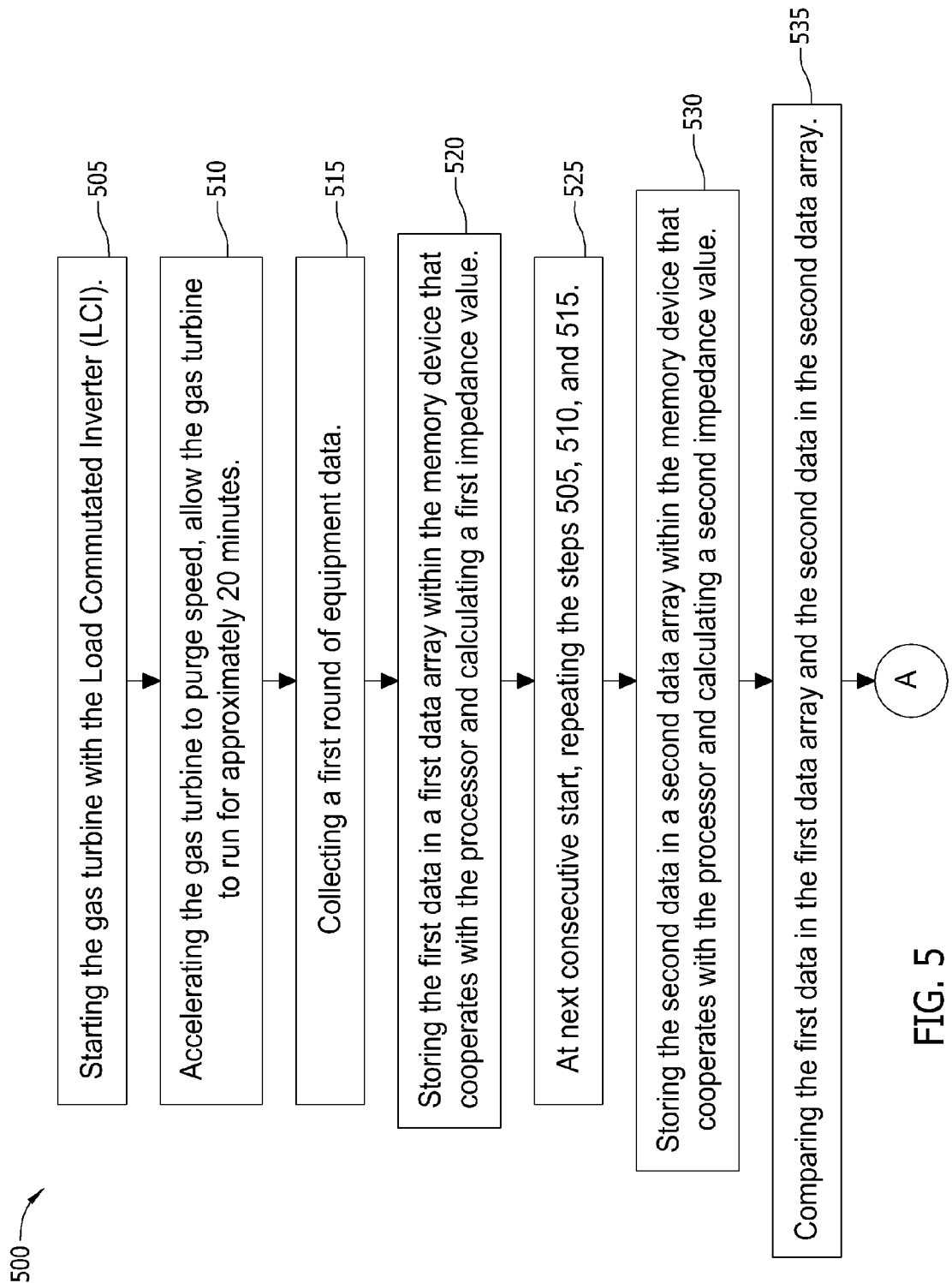
FIG. 5 is a flowchart of an exemplary method that may be implemented to monitor and evaluate operation of the synchronous machine shown in FIGS. 3 and 4.
Figure 6:
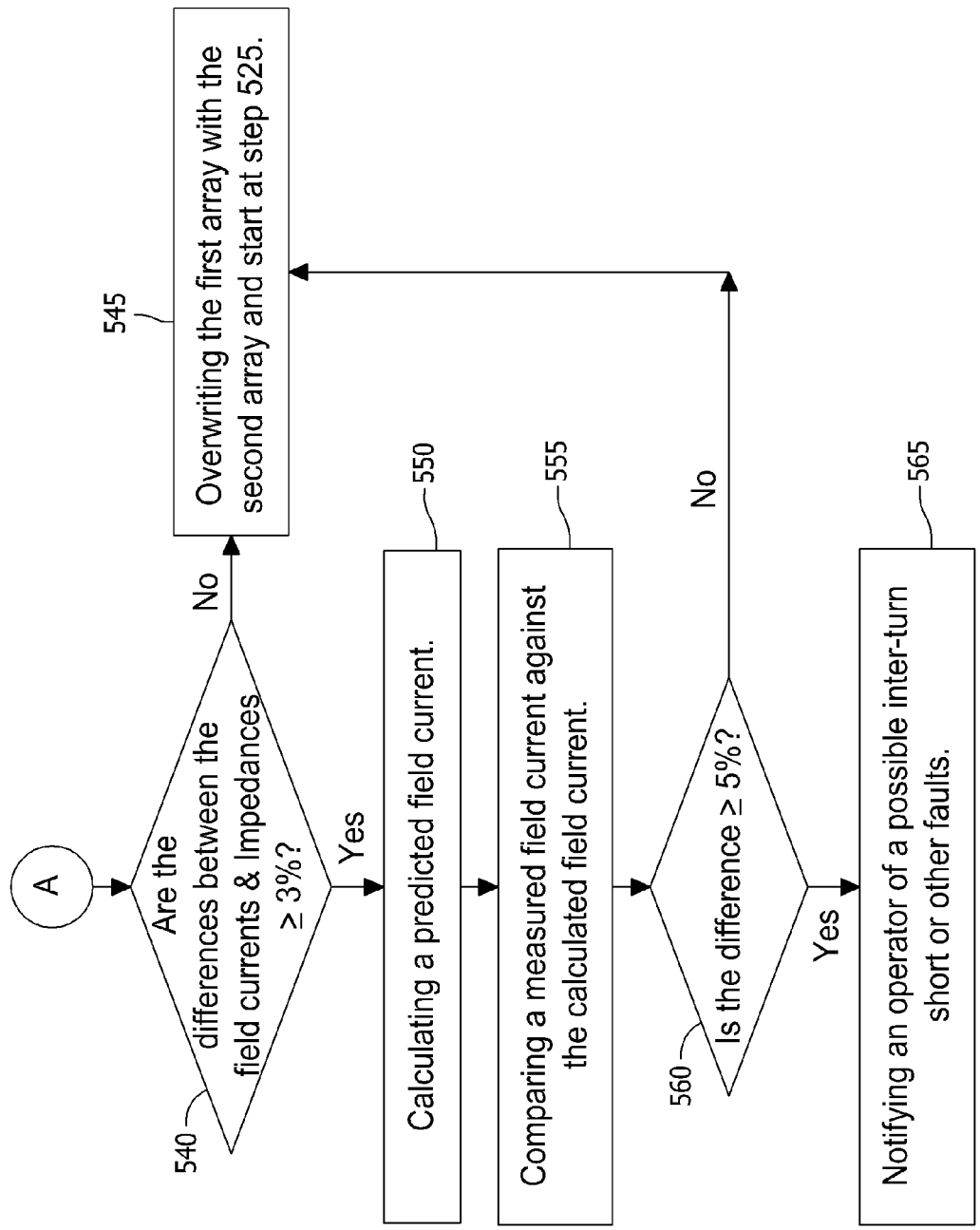
FIG. 6 is a continuation of the flowchart from FIG. 5.

FIG. 5 is a flowchart of an exemplary method 500 that may be implemented to monitor and evaluate operation of synchronous machine 300 (shown in FIGS. 3 and 4). FIG. 6 is a continuation of the flowchart from FIG. 5. In the exemplary embodiment, LCI 420 (shown in FIG. 4) facilitates starting 505 gas turbine 450 (shown in FIG. 4). As part of the startup activities, gas turbine 450 is accelerated 510 to purge speed and gas turbine 450 is substantially maintained at the purge speed for approximately 20 minutes, thereby facilitating field, or rotor windings 315 (shown in FIG. 3) attaining a substantially stable operating temperature of windings 315. A first plurality of equipment data is collected 515. Such data includes, without limitation, vibration readings, exciter field voltage and current readings, exciter field reference setpoints, stator voltage and current readings, stator and rotor field winding temperatures, rotor speed and speed reference readings, wherein such data is date and time stamped. Such first data is stored in a first data array within memory device 110 (shown in FIG. 1), and memory device 110, in cooperation with processor 115 (shown in FIG. 1), calculates 520 a first impedance value as "seen" by LCI 420 based on the first recorded data and predetermined values. The purge speed facilitates data collection by facilitating substantially consistent data, wherein the torque supplied to rotor 310 (shown in FIG. 3) is substantially electrically induced by LCI 420.

At the next consecutive start of gas turbine 405, steps 505, 510, and 515 are repeated 525. Recorded second data is stored in a second data array within memory device 110, and memory device 110, in cooperation with processor 115, calculates 530 a second impedance value as "seen" by LCI 420 based on the second recorded data and predetermined values. All of the data stored in the first data array and the second data array are compared 535. Differences between the first and second field currents and the first and second impedance values are determined 540 on a percentile basis. If the percentile differences between the first and second field currents and the first and second impedance values are less than 3%, the data in the first array is overwritten 545 by the data in the second array and the process is repeated starting at method step 525.

If the percentile differences between the first and second field currents and the first and second impedance values are greater than or equal to 3%, memory device 110 and processor 115 calculate 550 a predicted field current value at any given instant during data collection. The predicted field current value is determined using algorithms and transfer functions based on residual error minimization of the transfer function and a vector sum of two-field current components. The measured field current is compared 555 against the calculated field current for a particular time. The difference between the measured field current and calculated field current is determined 560 on a percentile basis. If the difference between the measured and calculated field currents is less than 5%, the data in the first array is overwritten 545 by the data in the second array and the process is repeated starting at method step 525. If the percentile differences between the first and second field currents and the measured and calculated field currents are greater than or equal to 5%, an operator is notified 565 of a possible inter-turn short or other faults.

In contrast to known maintenance inspection and operational flux measurement processes for synchronous machines, the monitoring methods, systems, and apparatus described herein provide low cost monitoring of possible rotor inter-turn short circuits in a synchronous machine. Specifically, in contrast to known maintenance inspection and operational flux measurement processes, the monitoring methods, systems, and apparatus described herein enable electrical data to be collected during periods in which the synchronous machine is maintained at a constant speed as part of the standard starting routine. Moreover, in further contrast to known maintenance inspection and operational flux measurement processes for synchronous machines, the monitoring methods, systems, and apparatus described herein enables routine collection of such data using existing monitoring hardware and software. Furthermore, in contrast to known maintenance inspection and operational flux measurement processes for synchronous machines, the monitoring methods, systems, and apparatus described herein enable rotor inter-turn shorts to be determined based on a comparison of data collected during sequential startups using the synchronous machine.

Use of the computer-based monitoring as described herein facilitates early detection of potential inter-turn shorts on the rotor of the synchronous machine, and may eliminate unnecessary maintenance inspection activities. Also, early detection of such potential inter-turn shorts prior to progression of such shorts to levels that may impact commercial production of the combustion engine may facilitate determining appropriate preventative and corrective measures that may be implemented during the next scheduled maintenance shutdown period. Further, determination of no inter-turn shorts may facilitate extending periods between scheduled maintenance shutdown periods and extending periods of commercial operation. Eliminating unnecessary activities and extending periods of commercial operation between scheduled maintenance shutdown periods may facilitate improving revenue generation and decreasing operating costs of the combustion engine.

An exemplary technical effect of the methods, systems, and apparatus described herein includes at least one of (a) collecting electrical monitoring data associated with a synchronous machine during startups of a combustion engine using the synchronous machine; (b) using existing sensor hardware and monitoring software to collect, store, and compare the startup data; (c) recording the electrical monitoring data during existing portions of the startups without interrupting commercial operation of the combustion engine; (d) determining potential inter-turn shorts on the rotor of the synchronous machine prior to progression of such shorts to levels that may impact commercial production of the combustion engine; and (e) determining potential inter-turn shorts on the rotor of the synchronous machine such that appropriate preventative and corrective measures may be implemented during the next scheduled maintenance shutdown period.

The methods and systems described herein are not limited to the specific embodiments described herein. For example, components of each system and/or steps of each method may be used and/or practiced independently and separately from other components and/or steps described herein. In addition, each component and/or step may also be used and/or practiced with other assemblies and methods.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

Some embodiments involve the use of one or more electronic or computing devices. Such devices typically include a processor or controller, such as a general purpose central processing unit (CPU), a graphics processing unit (GPU), a microcontroller, a reduced instruction set computer (RISC) processor, an application specific integrated circuit (ASIC), a programmable logic circuit (PLC), and/or any other circuit or processor capable of executing the functions described herein. The methods described herein may be encoded as executable instructions embodied in a computer readable medium, including, without limitation, a storage device and/or a memory device. Such instructions, when executed by a processor, cause the processor to perform at least a portion of the methods described herein. The above examples are exemplary only, and thus are not intended to limit in any way the definition and/or meaning of the term processor.

While the invention has been described in terms of various specific embodiments, those skilled in the art will recognize that the invention can be practiced with modification within the spirit and scope of the claims.

What is claimed is:

1. A method for use in monitoring a synchronous machine that includes a plurality of winding inter-turn portions, said method comprising:
    energizing the synchronous machine via a power conversion assembly coupled to the synchronous machine and to an electric power source;
    recording, by a computing device, at least one first operational measurement of at least one of the power conversion assembly and of the synchronous machine, wherein the at least one first operational measurement is taken at a first instance of a preselected operating condition of the synchronous machine;
    calculating, by the computing device, a first impedance downstream of the power conversion assembly based on the at least one first operational measurement;
    recording, by the computing device, at least one second operational measurement of at least one of the power conversion assembly and the synchronous machine, wherein the at least one second operational measurement is taken at a second instance of the preselected operating condition of the synchronous machine;
    calculating, by the computing device, a second impedance downstream of the power conversion assembly based on the at least one second operational measurement; and
    estimating, by the computing device, at least one short circuit associated with adjacent winding inter-turn portions based on the first and second operational measurements.

2. A method in accordance with claim 1 further comprising comparing, by the computing device, at least one of:
    the first calculated impedance and the second calculated impedance downstream of the power conversion assembly; and
    the at least one first operational measurement and the at least one second operational measurement.

3. A method in accordance with claim 2, wherein comparing, by the computing device, comprises determining a percentage increase between the first calculated impedance and the second calculated impedance downstream of the power conversion assembly.

4. A method in accordance with claim 2, wherein comparing, by the computing device, comprises determining a percentage increase between the at least one first operational measurement and the at least one second operational measurement.

5. A method in accordance with claim 1, wherein energizing the synchronous machine via the power conversion assembly comprises operating the synchronous machine as a synchronous motor.

6. A method in accordance with claim 5, wherein operating the synchronous machine as a synchronous motor comprises starting a combustion engine, and wherein the preselected operating condition comprises holding a rotational speed of the combustion engine substantially constant while recording by the computing device each of the at least one first operational measurement and the at least one second operational measurement.

7. A method in accordance with claim 1, wherein:
recording, by the computing device, at least one first operational measurement comprises recording a first field current transmitted from the power conversion assembly to the synchronous machine; and
recording, by the computing device, at least one second operational measurement of at least one of the power conversion assembly and the synchronous machine comprises recording a second field current transmitted from the power conversion assembly to the synchronous machine.

8. A method in accordance with claim 7, wherein estimating, by the computing device, at least one short circuit comprises at least one of:
calculating, with the computing device, an increase in the field current transmitted from the power conversion assembly to the synchronous machine based on comparing the first field current measurement and the second field current measurement by the computing device; and
calculating, with the computing device, an increase in the calculated impedances downstream of the power conversion assembly based on comparing the first calculated impedance and the second calculated impedance.

9. A system for use in monitoring a synchronous machine including a plurality of winding inter-turn portions, the synchronous machine operatively coupled to a power conversion assembly, said system comprising:
a memory device configured to store a plurality of operational measurements of at least one of the power conversion assembly and the synchronous machine, wherein each operational measurement is associated with an instance of a preselected operating condition of the synchronous machine; and
a processor operatively coupled in communication with said memory device, said memory device comprising programmed computer instructions that instruct said processor to:
calculate a plurality of impedances downstream of the power conversion assembly based on the plurality of operational measurements, wherein each calculated impedance is associated with a time; and
estimate at least one short circuit associated with adjacent winding inter-turn portions based on the calculated impedances.

10. A system according to claim 9, wherein said memory device further comprises programmed computer instructions that instruct said processor to compare at least one of:
the plurality of calculated impedances downstream of the power conversion assembly; and
the plurality of operational measurements of at least one of the power conversion assembly and the synchronous machine.

11. A system according to claim 9, wherein the power conversion assembly and the synchronous machine are operatively coupled such that the power conversion assembly drives the synchronous machine as a synchronous motor to start a combustion engine, wherein said memory device further comprises programmed computer instructions that instruct said processor to:
record at least one first operational measurement of at least one of the power conversion assembly and the synchronous machine; and
record at least one second operational measurement of at least one of the power conversion assembly and the synchronous machine.

12. A system according to claim 9, wherein said memory device further comprises programmed computer instructions that instruct said processor to calculate an increase in a field current transmitted from the power conversion assembly to the synchronous machine based on the comparison of the plurality of operational measurements of at least one of the power conversion assembly and the synchronous machine.

13. A system according to claim 12, wherein said memory device further comprises programmed computer instructions that instruct said processor to notify an operator of said system that a percentage increase in the field current transmitted from the power conversion assembly to the synchronous machine exceeds a predetermined value.

14. A system according to claim 9, wherein said memory device further comprises programmed computer instructions that instruct said processor to at least one of:
calculate an increase in the calculated impedances downstream of the power conversion assembly based on the comparison of the plurality of calculated impedances downstream of the power conversion assembly; and
notify an operator of said system that a percentage increase in the calculated impedances downstream of the power conversion assembly exceeds a predetermined value.

15. One or more non-transitory computer-readable storage media having computer-executable instructions embodied thereon, wherein when executed by at least one processor, the computer-executable instructions cause the processor to:
communicate with a memory device to cause the memory device to store and retrieve a plurality of operational measurements of at least one of a power conversion assembly and a synchronous machine operatively coupled to the power conversion assembly, wherein each operational measurement is associated with an instance of a preselected operating condition of the synchronous machine;
calculate a plurality of impedances downstream of the power conversion assembly based on the plurality of operational measurements, wherein each calculated impedance is associated with a time; and
estimate at least one short circuit associated with adjacent winding inter-turn portions in the synchronous machine based on the calculated impedances.

16. The computer-readable storage media of claim 15, wherein the computer-executable instructions further cause the processor to compare at least one of:
the plurality of calculated impedances downstream of the power conversion assembly; and the plurality of operational measurements of at least one of the power conversion assembly and the synchronous machine.

17. The computer-readable storage media of claim 15, wherein the computer-executable instructions further cause the processor to:
    record at least one first operational measurement of at least one of the power conversion assembly and the synchronous machine; and
    record at least one second operational measurement of at least one of the power conversion assembly and the synchronous machine.

18. The computer-readable storage media of claim 15, wherein the computer-executable instructions further cause the processor to calculate an increase in a field current transmitted from the power conversion assembly to the synchronous machine based on the comparison of the plurality of operational measurements of at least one of the power conversion assembly and the synchronous machine.

19. The computer-readable storage media of claim 18, wherein the computer-executable instructions further cause the processor to notify an operator that a percentage increase in the field current transmitted from the power conversion assembly to the synchronous machine exceeds a predetermined value.

20. The computer-readable storage media of claim 15, wherein the computer-executable instructions further cause the processor to at least one of:
    calculate an increase in the calculated impedances downstream of the power conversion assembly based on the comparison of the plurality of calculated impedances downstream of the power conversion assembly; and
    notify an operator that a percentage increase in the calculated impedances downstream of the power conversion assembly exceeds a predetermined value.

* * * * *